United States Patent
Vanderpot et al.

(10) Patent No.: US 7,323,695 B2
(45) Date of Patent: *Jan. 29, 2008

(54) RECIPROCATING DRIVE FOR SCANNING A WORKPIECE

(75) Inventors: John W. Vanderpot, Boxford, MA (US); John D. Pollock, Rowley, MA (US); Donald W. Berrian, Topsfield, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 222 days.

This patent is subject to a terminal disclaimer.

(21) Appl. No.: 11/098,878

(22) Filed: Apr. 5, 2005

(65) Prior Publication Data
US 2005/0232748 A1  Oct. 20, 2005

Related U.S. Application Data

(60) Provisional application No. 60/569,338, filed on May 7, 2004, provisional application No. 60/559,672, filed on Apr. 5, 2004.

(51) Int. Cl.
*G01F 23/00* (2006.01)
(52) U.S. Cl. .............. 250/440.11; 250/441.11; 250/442.11; 250/492.21
(58) Field of Classification Search ......... 250/440.11, 250/441.11, 442.11, 492.21
See application file for complete search history.

(56) References Cited

U.S. PATENT DOCUMENTS

| | | |
|---|---|---|
| 4,736,107 A | 4/1988 | Myron |
| 5,486,080 A | 1/1996 | Sieradzki |
| 5,737,500 A | 4/1998 | Seraji et al. |
| 5,741,113 A | 4/1998 | Bacchi et al. |
| 5,746,565 A | 5/1998 | Tepolt |
| 6,384,418 B1 | 5/2002 | Fujii et al. |

(Continued)

FOREIGN PATENT DOCUMENTS

EP  1 047 101 A2  10/2000

(Continued)

OTHER PUBLICATIONS

International Search Report, Int'l Application No. PCT/US2005/011497, Int'l Filing Date May 4, 2005, 2 pgs.

(Continued)

*Primary Examiner*—David Vanore
(74) *Attorney, Agent, or Firm*—Eschweiler & Associates, LLC

(57) ABSTRACT

A reciprocating drive system, method, and apparatus for scanning a workpiece are provided, wherein a motor comprising a rotor and stator operable to individually rotate about a first axis is operable to reciprocally translate the workpiece with respect to a stationary reference. A shaft rotatably driven by the rotor extends along the first axis, and a scan arm is operably coupled to the shaft, wherein the scan arm is operable to support the workpiece thereon. Cyclical counter rotations of the shaft by the motor are operable to rotate the scan arm, therein scanning the workpiece through the ion beam along a first scan path, wherein the stator acts as a reaction mass to the rotation of the rotor. A controller is further operable to control an electromagnetic force between the rotor and the stator, therein generally determining a rotational position of the rotor and the stator.

25 Claims, 8 Drawing Sheets

U.S. PATENT DOCUMENTS

| | | |
|---|---|---|
| 6,428,266 B1 | 8/2002 | Solomon et al. |
| 6,429,442 B1 | 8/2002 | Tomita et al. |
| 6,515,288 B1 | 2/2003 | Ryding et al. |
| 6,580,083 B2 | 6/2003 | Berrian |
| 6,777,687 B2 | 8/2004 | Vanderpot et al. |
| 6,953,942 B1 | 10/2005 | Graf et al. |
| 7,112,808 B2 * | 9/2006 | Ioannou et al. ......... 250/492.21 |
| 7,119,343 B2 * | 10/2006 | Asdigha et al. ......... 250/442.11 |
| 7,135,691 B2 * | 11/2006 | Vanderpot et al. ....... 250/492.1 |
| 7,141,809 B2 * | 11/2006 | Vanderpot et al. ..... 250/492.21 |
| 2001/0032937 A1 | 10/2001 | Berrian |
| 2003/0068215 A1 | 4/2003 | Mori et al. |
| 2003/0123958 A1 | 7/2003 | Sieradzki et al. |
| 2003/0192474 A1 | 10/2003 | Smick et al. |
| 2004/0058513 A1 | 3/2004 | Murrell et al. |
| 2004/0191931 A1 | 9/2004 | Murrell et al. |
| 2005/0184253 A1 | 8/2005 | Ioannou et al. |

FOREIGN PATENT DOCUMENTS

| | | |
|---|---|---|
| EP | 1 056 114 A2 | 11/2000 |
| GB | 2 386 469 A | 9/2003 |
| GB | 2 389 958 A | 12/2003 |
| JP | 11 007 915 | 1/1999 |
| WO | WO 00/05744 A1 | 2/2000 |
| WO | WO 01/88949 A2 | 11/2001 |
| WO | WO 2004/001789 A2 | 12/2003 |

OTHER PUBLICATIONS

International Search Report, Int'l Application No. PCT/US2005/040692, Int'l Filing Date Nov. 5, 2005, 3 pgs.

* cited by examiner

RECIPROCATING DRIVE FOR SCANNING A WORKPIECE

REFERENCE TO RELATED APPLICATION

This application claims priority to and the benefit of U.S. Provisional Application Ser. No. 60/559,672 which was filed Apr. 5, 2004, entitled RECIPROCATING DRIVE SYSTEM AND METHOD and U.S. Provisional Application Ser. No. 60/569,338 which was filed May 7, 2004, entitled RECIPROCATING DRIVE SYSTEM AND METHOD, the entirety of which are hereby incorporated by reference as if fully set forth herein.

FIELD OF THE INVENTION

The present invention relates generally to translational scanning systems, and more specifically to a system, apparatus, and method for controlling reciprocating transport of a workpiece to provide precision scanning of the workpiece.

BACKGROUND OF THE INVENTION

In the semiconductor industry, various manufacturing processes are typically carried out on a workpiece (e.g., a semiconductor wafer) in order to achieve various results thereon. Processes such as ion implantation, for example, can be performed in order to obtain a particular characteristic on or within the workpiece, such as limiting a diffusivity of a dielectric layer on the workpiece by implanting a specific type of ion. Conventionally, ion implantation processes are performed in either a batch process, wherein multiple workpieces are processed concurrently, or in a serial process, wherein a single workpiece is individually processed. Traditional high-energy or high-current batch ion implanters, for example, are operable to achieve an ion beam-line, wherein a large number of wafers may be placed on a wheel or disk, and the wheel is spun and radially translated through the ion beam, thus exposing all of the surface area of the workpieces to the beam at various times throughout the process. Processing batches of workpieces in such a manner, however, generally increases the cost of the system, makes the ion implanter substantially large in size, and reduces system flexibility.

In a typical serial process, on the other hand, an ion beam is either scanned two-dimensionally across a stationary wafer, or the wafer is translated in one direction with respect to a generally stationary fan-shaped ion beam. The process of scanning or shaping a uniform ion beam, however, generally requires a complex beam-line, which is generally undesirable at low energies. Furthermore, uniform translation or scanning of either the ion beam or the wafer is generally required in order to provide a uniform ion implantation across the wafer. However, such a uniform translation and/or rotation can be difficult to achieve, due, at least in part, to substantial inertial forces associated with moving the conventional devices and scan mechanisms during processing.

Alternatively, in one known scanning apparatus, as disclosed in U.S. Patent Application Publication No. 2003/0192474, the wafer is scanned in two orthogonal dimensions with respect to a stationary "spot" ion beam, wherein the wafer is quickly scanned in a so-called "fast scan" direction and then slowly scanned in an orthogonal "slow scan" direction, thereby "painting" the wafer via a generally zigzag pattern. This two-dimensional scanning apparatus, however, utilizes direct drive actuators to linearly translate the wafer in the fast scan direction, wherein the transport velocity of the wafer in the fast scan direction is substantially limited due, at least in part, to significant inertial forces encountered during acceleration and deceleration of the wafer as the direction of fast scan transport is periodically reversed. Large inertial forces in the conventional apparatus are accordingly associated with a large reaction force at the direct drive actuator, wherein the large reaction force can ultimately lead to significant vibration of the apparatus, thus having a deleterious impact on the ion implantation process. Vibration may also pose a problem for nearby equipment, such as lithography equipment that is typically vulnerable to vibration. Furthermore, when the speed of the translation in the fast scan direction is limited in order to avoid vibration issues, process throughput can be deleteriously impacted.

Therefore, a need exists for a system and apparatus for reciprocally scanning a workpiece in two dimensions relative to an ion beam at substantially high speeds, wherein vibration from large inertial forces is mitigated, and wherein the scanning of the workpiece is controlled in order to uniformly process the workpiece.

SUMMARY OF THE INVENTION

The present invention overcomes the limitations of the prior art by providing a system and apparatus that generally confines forces associated with reciprocally scanning a workpiece to various components aligned along a single axis, thus substantially limiting vibration to enable increased process speeds. Consequently, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is directed generally toward a system, apparatus, and method for reciprocally scanning a workpiece. According to one exemplary aspect of the invention, a process chamber associated with the ion beam is provided, wherein a motor is operably coupled to the process chamber. The motor comprises a rotor and a stator, wherein the rotor and the stator are each dynamically mounted relative to one another about a first axis such that the rotor and stator are operable to individually rotate and counter-rotate about the first axis. As in the case of a typical motor having a stator and a rotor, an electromagnetic force between the rotor and the stator to generally determine a rotational position of the rotor about the first axis. However, in view of the dynamic coupling of the stator relative to the rotor, the stator is operable to act as a reaction mass responsive to the rotation of the rotor, particularly during periodic reversal of the direction of rotation of the rotor.

According to one exemplary embodiment of the invention, a shaft is fixedly coupled to the rotor, wherein the shaft extends along the first axis into the process chamber. A scan arm generally residing within the process chamber is operably coupled to the shaft in a radial configuration, wherein the scan arm comprises an end effector or other workpiece support member for receiving and restraining the workpiece at a distal end of the scan arm. As such, rotation of the shaft causes the scan arm, being generally fixedly coupled thereto, to correspondingly rotate about the first axis. Rotation of the shaft is selectively reversed to generate a swinging motion of the scan arm in a pendulum type manner, wherein the workpiece is reciprocatingly transported along a first, generally arcuate, scan path and the rotational position of the rotor generally determines a position of the workpiece with respect to the ion beam along the first scan path. According to another example, a controller is provided, wherein the controller is operable to control the position of the workpiece along the first scan path by controlling the electromagnetic force between the rotor and the stator.

In accordance with another exemplary aspect of the invention, a generally constant velocity of the end effector can be maintained in a predetermined range of motion along the first scan path, wherein a translational velocity of the end effector with respect to a generally stationary reference is controlled, and wherein acceleration and deceleration of the end effector occurs outside of the predetermined range of motion of the end effector.

According to another exemplary aspect of the invention, an inertial mass is coupled to the stator, wherein the inertial mass rotates about the first axis and generally provides a reversal of direction of rotation of the scan arm, and thus, a reversal of direction of the workpiece along the first scan path. The inertial mass is further balanced about the first axis, wherein a torque in relation to the first axis is generally minimized. Therefore, the electromagnetic force between the rotor and the stator is operable to rotate the stator in reaction to an acceleration or deceleration of the rotor, thus generally confining inertial forces to the first axis.

The rotor, stator, and scan arm, according to another example, are generally balanced about the first axis, wherein torque associated with the first axis is generally minimized. One or more counterweights may be associated with the stator and scan arm, wherein the one or more counterweights generally balance the respective components about the first axis. Furthermore, according to another exemplary aspect of the invention, the stator comprises an inertial mass coupled thereto, wherein the inertial mass is significantly greater than that of the scan arm, and wherein a force on the stator caused by the oscillation of the scan arm is generally absorbed by the rotation of the inertial mass and the stator. Still further, a control of the rotation of the scan arm about the first axis by controlling the electromagnetic force between the rotor and the stator is operable to precisely control the rotation of the rotor.

According to yet another exemplary aspect, the motor and associated scan arm are further operable to translate along a second scan path, generally referred to as a slow scan axis, wherein the second scan path, for example, is generally perpendicular to at least a portion of the first scan path.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
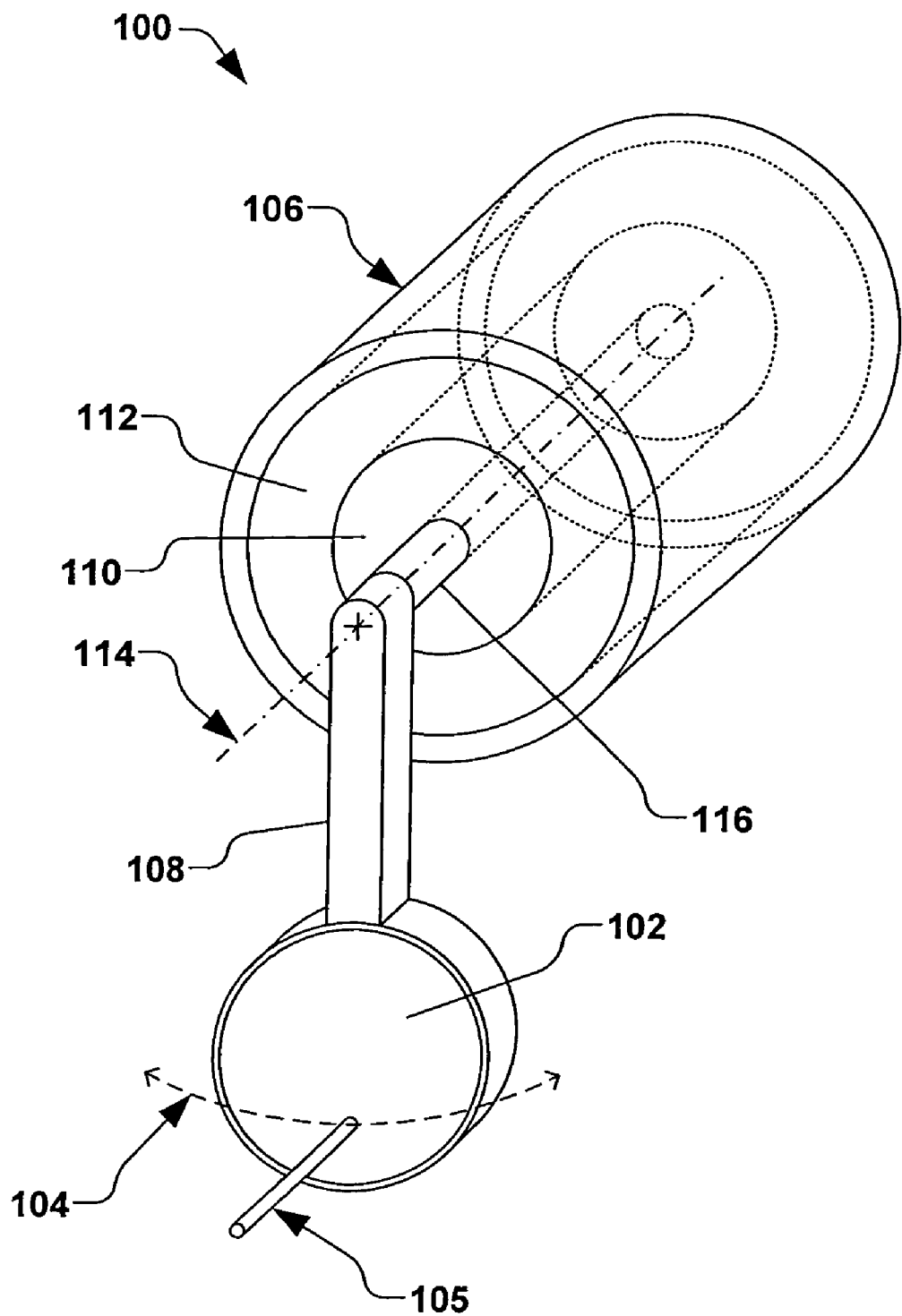
FIG. 1 is a simplified perspective view of an exemplary reciprocating drive apparatus according to one aspect of the present invention.

The present invention is directed generally towards a reciprocating drive system, apparatus, and method for reciprocally translating a workpiece in one or more dimensions. More particularly, the reciprocating drive apparatus is operable to translate the workpiece in two generally orthogonal dimensions along respective first and second scan paths with respect to an ion beam, wherein the workpiece may be translated at a generally constant translational or linear velocity when being subjected to the ion beam. Furthermore, as implied by the term "reciprocating drive apparatus", the apparatus and method of the present invention provide a reciprocating and selectively reversible transport of the workpiece along the first scan path, and is advantageously operable to limit vibration and to optimize control of the reciprocating or oscillating transport motion of the workpiece along the first scan path. In particular, the reciprocating drive apparatus of the present invention comprises a reaction mass, wherein the reaction mass generally confines forces exerted by the reciprocating drive apparatus to the apparatus itself by rotating about a single axis.

In further detail, the reciprocating drive apparatus comprises a motor having a rotor and a stator, wherein each of the rotor and stator are dynamically mounted relative to one another about a single axis, and operable to rotate individually about the single axis. This dynamic mounting configuration and relationship between the stator and rotor permits rapid acceleration and deceleration of the workpiece at opposite ends of the scan path, wherein a generally uniform translation (e.g., constant acceleration/deceleration or velocity) of the workpiece can be attained within a predetermined range, and wherein inertial forces associated with the translational motion, and particularly forces associated with reversal of the scan direction associated with the reciprocating motion of the apparatus, are substantially confined to the axis of rotation. Accordingly, the present invention will now be described With reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details.

Referring now to the figures, in accordance with one exemplary aspect of the present invention, FIG. 1 illustrates a simplified perspective view of an exemplary reciprocating drive apparatus 100 operable to reciprocally translate or oscillate a workpiece 102 along a predetermined first scan path 104. It should be noted that the reciprocating drive apparatus 100 of FIG. 1 is illustrated to provide an upper-level understanding of the invention, and is not necessarily drawn to scale. Accordingly, various components may or may not be illustrated for clarity purposes. It shall be understood that the various features illustrated can be of various shapes and sizes, or excluded altogether, and that all such shapes, sizes, and exclusions are contemplated as falling within the scope of the present invention.

As implied by the use of the term "reciprocating drive apparatus", in one example, the drive apparatus of the present invention is operable to reciprocally translate or oscillate the workpiece 102 in a reversible motion along the first scan path 104, such that the workpiece translates alternatingly back and forth with respect to a generally stationary ion beam 105, wherein the apparatus can be utilized in an ion implantation process, as will be discussed hereafter in greater detail. Alternatively, the reciprocating drive apparatus 100 may be utilized in conjunction with various other processing systems, which may include other semiconductor manufacturing processes such as, for example, a step-and-repeat lithography system (not shown). In yet another alternative, the apparatus 100 can be utilized in various processing systems not related to semiconductor manufacturing technology, and all such systems and implementations are contemplated as falling within the scope of the present invention.

According to one aspect of the present invention, the reciprocating drive apparatus 100 comprises a motor 106 operably coupled to a scan arm 108 wherein the scan arm is further operable to support the workpiece 102 thereon. The motor 106, for example, comprises a rotor 110 and a stator 112, wherein the rotor and the stator are dynamically coupled and operable to individually rotate about a first axis 114. The rotor 110 is further operably coupled to a shaft 116, wherein the shaft generally extends along the first axis 114 and is operably coupled to the scan arm 108. In the present example, the rotor 110, shaft 116, and scan arm 108 are generally fixedly coupled to one another, wherein rotation of the rotor about the first axis 114 generally drives rotation of the shaft and scan arm about the first axis, thus generally translating the workpiece 102 along the first scan path 104. Alternatively, the rotor 110, shaft 116, and scan arm 108 may be otherwise coupled to one another, wherein the rotation of the rotor and/or shaft may drive a linear translation of the scan arm with respect to the first axis 114, as will be further discussed infra.

Figure 2:
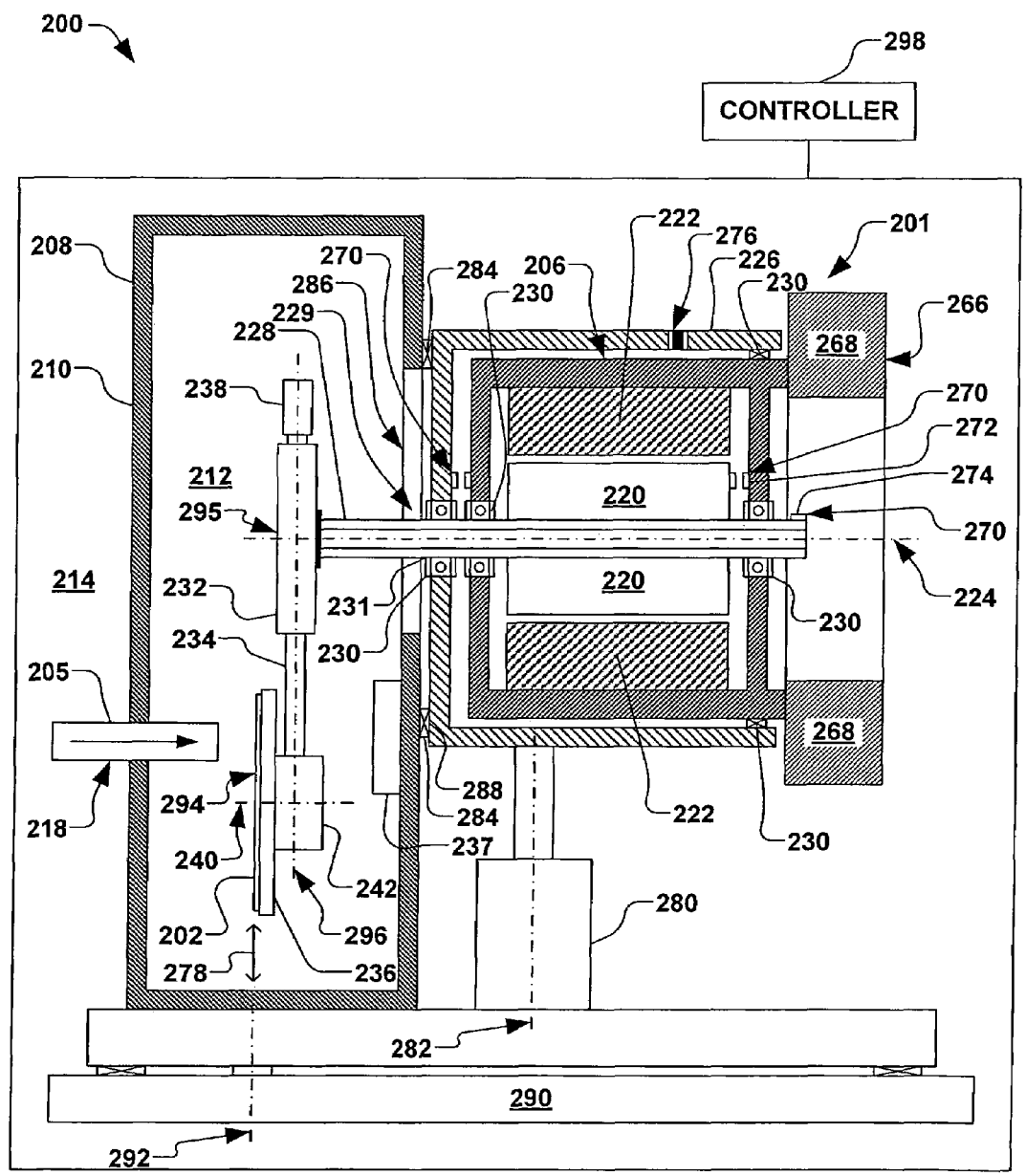
FIG. 2 is a cross-sectional side view of an exemplary reciprocating drive system according to another aspect of the invention.

Referring now to FIGS. 2 and 6-8, an exemplary reciprocating drive system 200 is illustrated in cross-section comprising a reciprocating drive apparatus 201, such as the reciprocating drive apparatus 100 of FIG. 1, wherein the reciprocating drive apparatus may be further utilized in an ion implantation process. It will be understood that the exemplary reciprocating drive system 200 of FIG. 2 is operable to scan a workpiece 202 through an ion beam 205 in two dimensions, as will be discussed in greater detail hereafter. According to one exemplary aspect of the present invention, the reciprocating drive system 200 comprises a motor 206, such as the motor 106 of FIG. 1, wherein the motor of FIG. 2 is operably coupled to a process chamber 208, and wherein the process chamber is further associated with the ion beam 205. The ion beam 205, for example, may comprise a group of ions traveling together along close, substantially parallel, trajectories taking the form of a spot or so-called "pencil beam", as may be formed by any suitable ion implantation system (not shown) known in the art, the details of which will not be discussed here.

According to the present invention, the process chamber 208 may comprise a generally enclosed vacuum chamber 210, wherein an internal environment 212 within the process chamber is operable to be generally isolated from an external environment 214 outside the process chamber. For example, the vacuum chamber 210 can be configured and equipped so as to maintain the internal environment 212 at a substantially low pressure (e.g., a vacuum). The process chamber 208 may be further coupled to one or more load lock chambers (not shown), wherein the workpiece may be transported between the internal environment 212 of the process chamber and the external environment 214 without substantial loss of vacuum within the process chamber. The process chamber 208 may alternatively be comprised of a generally non-enclosed process space (not shown), wherein the process space is generally associated with the external environment 214.

In one example, the process chamber 208 serves as a generally stationary reference 216, wherein the process chamber is generally fixed with respect to the external environment 214. In another example, a process medium 218, such as the ion beam 205, serves as the generally stationary reference 216, wherein the process chamber 208 is operable to move with respect to the process medium. The process medium 218, for example, may be alternatively associated with other semiconductor processing technologies. For example, the process medium 218 may comprise a light source (not shown) associated with a lithography process. Accordingly, the present invention contemplates any process chamber 208 and process medium 218 operable to be utilized in processing the workpiece 202, whether the process chamber be enclosed, non-enclosed, fixed, or transitory, and all such process chambers and process mediums are contemplated as falling within the scope of the present invention.

In accordance with another exemplary aspect of the invention, the motor 206 comprises a rotor 220 and a stator 222, wherein the rotor and the stator are operable to individually rotate about a first axis 224, and wherein an electromagnetic force (not shown) between the rotor and the stator generally drives a rotation of the rotor about the first axis. For example, a control of the electromagnetic force between the rotor 220 and the stator 222 is operable to selectively drive the rotation of the rotor in a clockwise or counter-clockwise direction about the first axis 224, as will be discussed infra. In another example, the motor 206 further comprises a motor housing 226, wherein the motor housing is generally stationary with respect to the first axis 224. The motor housing 226 in the present example generally encases the rotor 220 and stator 222, and further generally serves as the generally stationary reference 216 for the rotation of the rotor and stator. A least a portion of the rotor 220 and stator 222 generally reside within the motor housing 226, however, the motor housing need not enclose the rotor and the stator. Accordingly, the rotor 220 and the stator 222 are operable to individually rotate with respect to the motor housing 226, wherein the motor housing is further operable to generally support the rotor and the stator therein. It should be noted that while the present example describes the motor housing 226 as being the generally stationary reference 216, other generally stationary references may be alternatively defined.

The motor 206, in one example, comprises a brushless DC motor, such as a three-phase brushless DC servo motor. The motor 206, for example, may be sized such that a substantially large diameter of the motor (e.g., a respective diameter of the stator 222, and/or the rotor 220) provides a substantially large torque, while maintaining a moment of inertia operable to provide rapid control of the rotation of the rotor. The reciprocating drive system 200 further comprises a shaft 228 operably coupled to the motor 206, wherein in one example, the shaft is fixedly coupled to the rotor 220 and generally extends along the first axis 224 into the process chamber 208. Preferably, the rotor 220 is directly coupled to the shaft 228, as opposed to being coupled via one or more gears (not shown), wherein such a direct coupling maintains a substantially low moment of inertia associated with the rotor, while further minimizing wear and/or vibration that may be associated with the one or more gears.

According to another example, the process chamber 208 comprises an aperture 229 therethrough, wherein the shaft 228 generally extends through the aperture from the external environment 214 to the internal environment 212, and wherein the motor 206 generally resides in the external environment. Accordingly, the shaft 228 is operable to rotate about first axis 224 in conjunction with the rotation of the rotor 220, wherein the shaft is generally rotatably driven by the rotor in alternating, opposite directions. In the present example, the shaft 228 may be substantially hollow, thereby providing a substantially low inertial mass. Likewise, the rotor 220 may be substantially hollow, further providing a substantially low rotational inertial mass.

One or more low-friction bearings 230, for example, are further associated with the motor 206 and the shaft 228, wherein the one or more low-friction bearings rotatably couple one or more of the rotor 220, the stator 222, and the shaft to a generally stationary reference, such as the housing 226 or the process chamber 208. The one or more low-friction bearings 230, for example, generally provide a low coefficient of friction between the respective rotor 220, stator 222, shaft 228, and motor housing 226. In another example, at least one of the one or more low-friction bearings 230 may comprise an air bearing (not shown), a liquid field environment, or other bearing known in the art.

In accordance with another exemplary aspect of the invention, the reciprocating drive apparatus 201 is partitioned from the process chamber 208, such that minimum wear and contamination occurs within the internal environment 212. For example, the shaft 228 is generally sealed between the process chamber 208 and the external environment 214 by a rotary seal associated with the shaft and the process chamber, wherein the internal environment 212 within the process chamber is generally isolated from the external environment.

The reciprocating drive system 200 further comprises a scan arm 232 operably coupled to the shaft 228, wherein the scan arm is operable to support the workpiece 202 thereon. According to another example, the scan arm 232 comprises an elongate arm 234 extending radially from the first axis 224, wherein the elongate arm is generally fixedly coupled to the shaft 228, wherein the rotation of the shaft about the first axis generally translates the workpiece 202 with respect to the first axis. In one example, the scan arm 232 is coupled to the shaft 228 at a center of gravity of the scan arm, wherein the scan arm is substantially rotationally balanced about the first axis 224. In another example, the scan arm 232 is comprised of a light weight material, such as magnesium or aluminum.

The scan arm 232 may further comprise an end effector 236 operably coupled thereto, whereon the workpiece 202 is generally supported thereon. The end effector 236, for example, comprises an electrostatic chuck (ESC) or other workpiece clamping device is operable to selectively clamp or maintain the workpiece 202 with respect to the end effector. The end effector 236 may comprise various other devices for maintaining a grip of the workpiece 202, such as a mechanical clamp or various other retaining mechanisms (not shown) as may be known in the art, and all such devices are contemplated as falling within the scope of the present invention.

In another example, the scan arm 232 may further comprise a counterweight 238 operably coupled thereto, wherein the counterweight generally balances a mass of the scan arm, end effector 236, and the workpiece 202 about the first axis 224. Such a counterweight 238 may advantageously assist in centering the mass moment of inertia of the scan arm 232 about the first axis 224, thus dynamically balancing the scan arm about the first axis. Accordingly, the scan arm 232, shaft 228, rotor 220, and stator 222 are generally dynamically balanced about the first axis 224, thus generally eliminating side load forces, other than gravitational forces. The counterweight 238, for example, may be comprised of heavier metal than the scan arm 232, such as steel.

In the case where the reciprocating drive apparatus of the present invention is utilized in an ion implantation system, the reciprocating drive apparatus 201 may further comprise a load lock chamber (not shown) associated with the process chamber 208, wherein scan arm 232 is further operable to rotate and/or translate the end effector 236 to the load lock chamber in order to insert or remove workpieces 202 to or from the process chamber. Furthermore, a faraday cup 237 is provided within the process chamber 208 and positioned within a path of the ion beam 205, wherein the faraday cup is operable to generally sense a beam current associated with the ion beam. Accordingly, the sensed beam current can be utilized for subsequent process control.

According to another exemplary aspect, the end effector 236 may be rotatably coupled to the scan arm 232 about a second axis 240, wherein the end effector is operable to rotate about the second axis. An end effector actuator 242 may be operably coupled to the scan arm 232 and the end effector 236, wherein the end effector actuator is operable to rotate the end effector about the second axis 240. The second axis 240, for example, is generally parallel to the first axis 224, wherein the end effector actuator 242 may be operable to selectively rotate the workpiece relative to the ion beam to vary the so-called "twist angle" of implant, as will be understood by those of skill in the ion implantation art. Alternatively, the rotatable coupling of the end effector 236 to the scan arm 232 may be utilized to maintain a rotational orientation (e.g., a rotational orientation 250 of FIG. 3) of the workpiece 202 with respect to the ion beam 205 by continuously controlling the rotation of the end effector 236 about the second axis 240. The end effector actuator 242 of FIG. 2 may comprise a motor (not shown) or mechanical linkage (not shown) associated with the scan arm 232 operable to maintain the rotational orientation of the workpiece 202 with respect to the ion beam 205. Alternatively, the end effector actuator 242 may comprise a pivot mount (not shown) associated with the second axis 240, wherein inertial forces associated with the workpiece 202 are operable to maintain the rotational orientation of the workpiece 202 with respect to the ion beam 205. Maintaining the rotational orientation of the workpiece 202 with respect to the ion beam 205 is advantageous when the ion beam impinges on the workpiece at a non-orthogonal angle (not shown), and/or when a crystalline or other structure associated with the workpiece (e.g., a semiconductor substrate, or a substrate having structures formed thereon) plays a role in the uniformity of the ion implantation.

Figure 3:
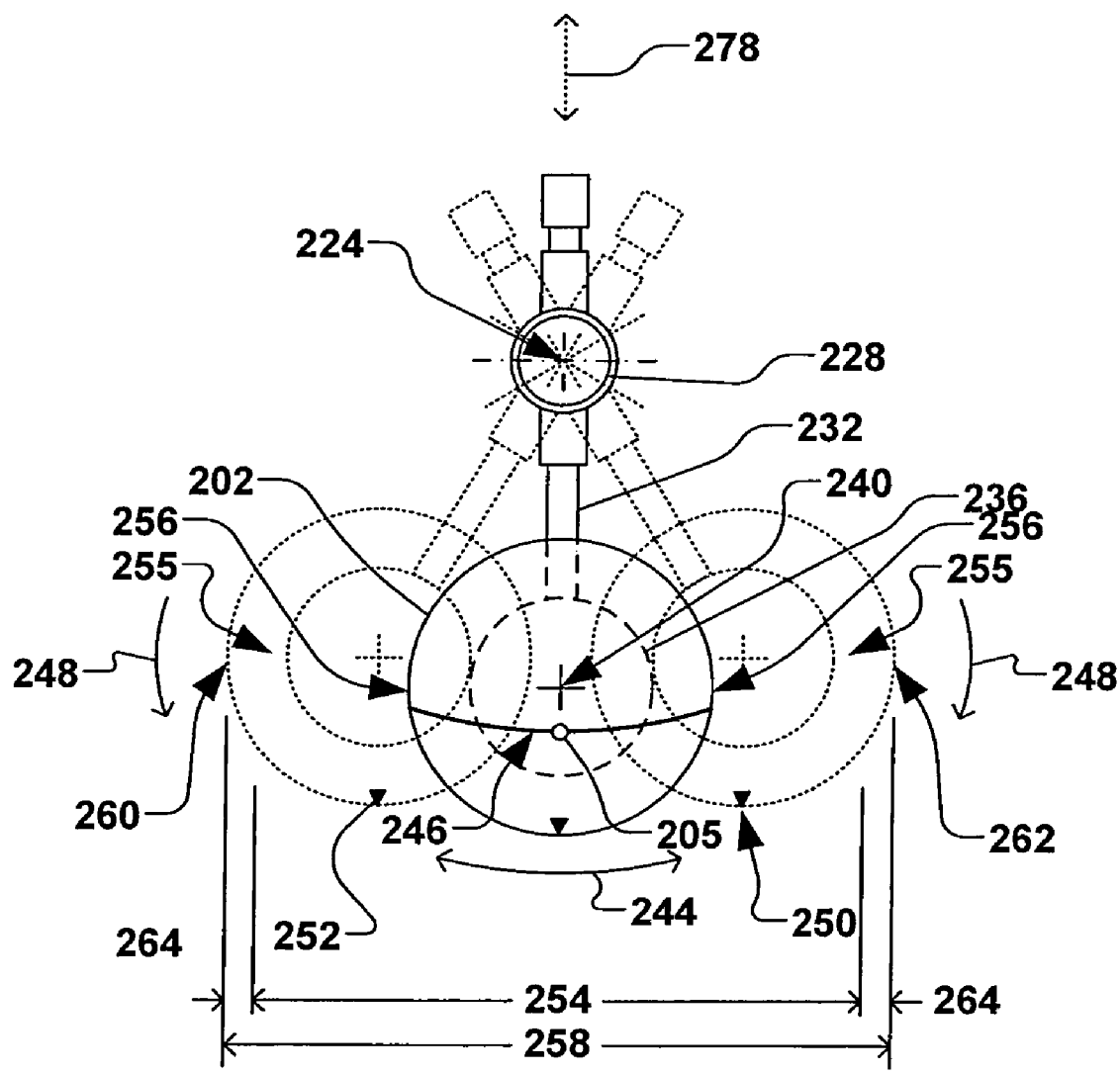
FIG. 3 is a partial side view of an exemplary scan arm according to another exemplary aspect of the invention.

Referring now to FIG. 3 an exemplary rotation 244 of the shaft 228 about the first axis 224 of FIG. 2 is illustrated, wherein the scan arm 232, end effector 236, and workpiece 202 are further rotated about the first axis. Accordingly, the workpiece 202 can be reciprocally translated along a first scan path 246 with respect to the ion beam 205 (e.g., via one or more cyclical counter-rotations of the shaft 228 about the first axis 224), wherein the ion beam of FIG. 2 is illustrated as going into the page of FIG. 3. The rotation 244 (and counter-rotation) of the shaft 228 about the first axis 224 can be advantageously controlled in order to oscillate or reciprocate the end effector 236 along the first scan path 246 in a uniform manner, as will be discussed hereafter. FIG. 3 further illustrates a rotation 248 of the end effector 236 about the second axis 240 as discussed above, wherein the rotation of the end effector, and hence, the workpiece 202, about the second axis can be further controlled in order to maintain the rotational orientation 250 of the workpiece with respect to the first axis 224 or ion beam 205 (e.g., rotational orientation of the workpiece with respect to the ion beam is indicated by a triangle 252 that is fixed with respect to the workpiece).

In order to evenly process the workpiece 202, such as providing an even implantation of ions into the workpiece from the ion beam 205, it is important to maintain a generally constant translational velocity of the end effector 236 when the workpiece is subject to the ion beam 205 while traveling along the first scan path 246. Maintaining a generally constant velocity of the end effector 236 while the workpiece passes 202 through the ion beam 205, for example, provides a generally uniform dose of ions to the workpiece, thus evenly processing the workpiece as it travels along the first scan path 246 in a pendulum-type motion.

Therefore, in one embodiment, a generally constant velocity is desired for a predetermined scanning range 254 associated with the movement of the workpiece 202 through the ion beam 205. The predetermined scanning range 254 is generally associated with the physical dimensions of the workpiece 202 (e.g., greater than a diameter D of the workpiece). In the present example, the predetermined scanning range 254 is generally defined by the workpiece 202 traveling a distance greater than a total of the diameter D of the workpiece plus a width of the ion beam 205, wherein the workpiece travels through the ion beam along the first scan path 246, and wherein the ion beam is relatively scanned between opposite ends 256 of the workpiece.

According to another embodiment, a desired velocity profile for the workpiece 202 within the predetermined scanning range 254 may be defined, wherein the desired velocity profile generally depends on a configuration of the reciprocating drive apparatus 201. For example, depending on whether the workpiece 202 is fixed or rotatable with respect to the scan arm 232, a respective generally constant velocity or a variable velocity of the rotation 244 of the scan arm (and thus, a respective generally constant or variable velocity of the workpiece along the first scan path 246) may be desired. If, for example, the workpiece 202 is rotated with respect to the scan arm 232 in order to maintain the rotational orientation 250 along the first scan path 246, the rotational velocity of the scan arm about the first axis 224 may be varied when the ion beam 205 nears ends 255 of the predetermined scanning range 254 (e.g., an increase in velocity by about 10% near the ends of the predetermined scan range) in order to provide a generally uniform dose of ions to the workpiece along the curvilinear path. As another alternative, or in addition to varying the velocity of the scan arm 232, properties of the ion beam 205, such as the ion beam current, can be varied in order to produce a generally uniform dosage of ions to the workpiece 202.

As indicated in one of the embodiments above, it is generally desirable for the workpiece 202 to maintain a substantially constant velocity within the predetermined scanning range 254 along the first scan path 246 in order to generally evenly expose the workpiece 202 to the ion beam 205. However, due to the reciprocating, alternatingly reversing, motion of the workpiece 202 along the first scan path 246, acceleration and deceleration of the workpiece is inevitable, such as between clockwise and counter-clockwise rotations (e.g., counter-rotations) of the shaft 228 about the first axis 224. Therefore, in order to accommodate acceleration and deceleration of the scan arm 232, end effector 236, and workpiece 202, a maximum scan distance 258 traveled by the opposite ends 256 of the workpiece 202 between maximum positions 260 and 262 along the first scan path 246 can be further defined, wherein the acceleration and deceleration can occur in overshoot regions 264, either when the ion beam 205 is not in contact with the workpiece, or when at least a portion of the ion beam is not in contact with the workpiece.

It is important to note that in conventional two-dimensional scanning systems, a permissible amount of acceleration and deceleration during a reversal of workpiece direction is substantially limited in order to minimize inertial forces and associated reaction forces transmitted to the remainder of the conventional scanning system. However, the present invention obviates such limitations, such that inertial forces are generally confined to the first axis 224, as will now be discussed in greater detail.

According to the present invention, rapid acceleration and deceleration of the workpiece 202 within the overshoot regions 264 is attained by generally confining inertial forces associated with one or more of the workpiece, end effector 236, scan arm 232, shaft 228, rotor 220, and stator 222 to the first axis 224. In accordance with one exemplary aspect of the invention, the stator 222 of FIG. 2, being operable to rotate about the first axis 224, is further operable to act as a reaction mass 266 to the rotation 244 of the scan arm 232 shown in FIG. 3. For example, the reaction mass 266 of FIG. 2 is operable to generally provide a rapid acceleration and deceleration of the rotor 220, shaft 228, scan arm 232, end effector 236, and workpiece 202, wherein inertial forces associated with the rotation and/or translation of the rotor, shaft, scan arm, end effector, and workpiece are generally translated into a rotation of the stator 222 about the first axis 224 by an electromagnetic force between the rotor and the stator, and wherein the inertial forces are generally balanced and confined to the first axis. Accordingly, torque associated with the rotation of the stator 222 is generally confined to the first axis 224, thus vibrationally isolating or decoupling the forces associated with the reciprocation of the workpiece 202 along the first scan path 246 from the stationary reference 216.

Such a confinement of the inertial forces to the first axis 224 substantially reduces vibration seen in conventional scanning systems. Accordingly, the stator 222, acting as the reaction mass 266, is therefore operable to accelerate and decelerate the scan 232 arm in the overshoot region 264 of FIG. 3, wherein the electromagnetic force between the stator and the rotor 220 of the motor 206 generally determines a rotational position of the respective rotor and the stator about the first axis. Accordingly, the rotational position of the rotor 220 about the first axis 224 generally determines the rotational position of the shaft 228, scan arm 232, end effector 236, and workpiece 202 about the first axis, wherein the rotational position of the rotor can be efficiently controlled by controlling the electromagnetic force between the rotor and the stator.

In accordance with another exemplary aspect of the invention, the stator 222 (e.g., wherein the stator acts as the reaction mass 266) has a substantially larger mass moment of inertia than that of one or more of the rotor 220, shaft 228, scan arm 232, end effector 236, and workpiece 202. According to another example, an inertial mass 268 (e.g., a "flywheel") is further operably coupled to the stator 222, wherein the inertial mass is further operable to act as the reaction mass 266 in order to further limit the rotation of the stator in reaction to (e.g., to counteract) the rotation of the rotor 220, scan arm 232, end effector 236, and workpiece 202 about the first axis 224. The inertial mass 268, for example, is generally greater than or equal to the total mass moments of inertia of one or more of the rotor 220, shaft 228, scan arm 232, end effector 236, and workpiece 202. In one example, the mass moment of inertia associated with the reaction mass 266 is roughly ten times greater than a total of the mass moments of inertia of the rotor 220, shaft 228, scan arm 232 (and counterweight 238), end effector 236, and workpiece 202, wherein for every ten degrees of rotation of the rotor, the stator 222 need only rotate one degree about the first axis 224. Providing a substantially large inertial mass 268, for example, further advantageously reduces back-EMF associated with the velocity of the rotor 220 relative to the stator 222, thus reducing an amount of energy required to drive the motor 206.

In accordance with yet another exemplary aspect of the present invention, the motor 206 of FIG. 2, for example, is operable to vary a rotational velocity of the shaft 228 (and hence, the translational velocity of the workpiece 202) in accordance with the rotational position of rotor 220 with respect to the stator 222. In accordance with another example, the reciprocating drive apparatus 201 further comprises one or more sensing elements 270, wherein the rotational position 244 of the workpiece 202 along the first scan path 246 can be further determined. For example, the one or more sensing elements 270 of FIG. 2 are operable to sense the rotational position of one or more of the scan arm 232, shaft 228, rotor 220, and stator 222 about the first axis 224, wherein the sensed rotational position(s) can be utilized for feedback control of the translational position of the workpiece 202 as will be described infra. For example, the one or more sensing elements 270 may comprise one or more high resolution encoders operable to continuously or repeatedly provide feedback control of the respective rotational position(s) about the first axis. In another example, the one or more sensing elements 270 comprise a first encoder 272 operable to sense a rotational orientation of the rotor 220 with respect to the stator 222, and a second encoder 274 operable to sense a rotational orientation of the rotor with respect to the stationary reference 216, such as the process chamber 208, motor housing 226, ion beam 205, or other stationary reference with respect to the rotor.

According to another exemplary aspect, the reciprocating drive apparatus 201 further comprises one or more stops 276, wherein the one or more stops generally limit the rotation of the stator 222 with respect to the motor housing 226. The one or more stops 276 generally provide a variable amount of rotation of the stator 222 to generally prevent a "runaway" incident, wherein the stator becomes uncontrollable. The one or more stops 276, for example, comprises one or more adjustable mechanical or electrical limits (not shown) operably coupled to the motor housing 226, wherein the amount of rotation of the stator 222 is generally constrained between the stops.

In another aspect of the present invention, the reciprocating drive apparatus 201 is further operable to translate the workpiece 202 along a second scan path 278, wherein the second scan path is substantially perpendicular to at least a portion of the first scan path 246 of FIG. 3. For example, the second scan path 278 is substantially perpendicular to the midpoint of the first scan path 246 illustrated in FIG. 3. The second scan path 270 may be achieved by means of a slow scan actuator 280, which is further operably coupled to the motor 206, wherein the slow scan actuator is operable to translate one or more of the motor and process chamber 208 along a third axis 282 with respect to the stationary reference 216. The third axis 282, for example, is generally perpendicular to the first axis 224, and is generally parallel to the second scan path 278 of the workpiece 202 with respect to the ion beam 205.

Thus, it will be understood, that, according to one exemplary aspect of the invention, the first scan path 246 is associated with a "fast scan" of the workpiece 202, and the second scan path 278 is associated a "slow scan" of the workpiece, wherein the workpiece may be continuously transported along the second scan path as the workpiece reciprocatingly travels along the first scan path. Alternatively, the workpiece 202 may be serially indexed an increment of predetermined length along the second scan path 278 for every translation of the workpiece between maximum positions 260 and 262 along the first scan path 246 (e.g., as illustrated in FIG. 3). For example, for a full back and forth oscillation cycle or reciprocation of the workpiece 202 along the first scan path 246, the slow scan actuator 280 will translate the workpiece two increments of predetermined length along the second scan path 278. A total translation of the motor 206 along the second scan path 278, for example, is approximately the diameter D of the workpiece 202 in FIG. 3 plus the height of the ion beam 205.

The slow scan actuator 280 of FIG. 2, for example, may comprise a servo motor, a ball screw, or other system (not shown), wherein the motor housing 226 and associated motor 206, and hence, the workpiece 202, can be smoothly translated along the second scan path 278. Such a slow scan actuator 280, for example, is operable to permit the stationary ion beam 205 to "paint" the workpiece 202 residing on the end effector 236 by passing the workpiece through the ion beam 205 while the end effector also travels along an arcuate scan path in cyclical counter-rotations (e.g., oscillation), thus uniformly implanting ions across the entire workpiece.

The reciprocating drive apparatus 201 may further comprise a dynamic sliding seal 284 (e.g., a sliding bearing seal), wherein the sliding seal substantially seals the internal environment 212 of the process chamber 208 from the external environment 214 (e.g., atmosphere). For example, the process chamber 208 may define a slot-shaped aperture 286 therethrough and extending generally parallel with the third axis 282, wherein the shaft 228 generally extends through the slot. One or more linear bearings 288, for example, may be utilized to slidingly couple the motor housing 226 to the process chamber 208. Accordingly, the shaft 228 is operable to translate within the slot 286 in conjunction with the translation of the motor 206 along the third axis 282. The sliding seal 284 further surrounds the slot-shaped aperture 286 and further generally isolates the internal environment 212 within the process chamber 208 from the external environment 214. Such a sliding seal 284, for example, further generally isolates the scan arm 232 and end effector 236, and permits the translation of the end effector within the process chamber 208 along the second scan path 278, while limiting potential deleterious effects caused by moving components associated with the motor 206. Alternatively, any or all of the reciprocating drive apparatus 201 may reside within the process chamber 208.

According to yet another exemplary aspect of the invention, a frame 290 is provided, wherein the frame is generally fixed relative to the ion beam 205. For example, the frame 290 can be further considered a stationary reference 216. In the present example, the process chamber 208 may be pivotally coupled to the frame 290 about a fourth axis 292 that is generally perpendicular to the ion beam 205, wherein a rotational position of the process chamber about the fourth axis further generally defines a tilt angle (not shown) between the ion beam and a surface 294 of the workpiece 202. In another example, the scan arm 232 is rotatably coupled to the shaft 228 via a hub 295, wherein the scan arm is further operable to rotate about a fifth axis 296. The fifth axis 296 is further generally perpendicular to the first axis 224, wherein a rotation of the scan arm 232 about the fifth axis alternatively provides the tilt angle (not shown) discussed above. The net effect of utilizing the fourth axis 292 to position the process chamber 208 in combination with the rotation of the workpiece 202 about the second axis 240 while the scan arm 232 rotates about first axis 224, is to generally sweep the workpiece through the ion beam 205 while maintaining a fixed tilt and twist angle of the workpiece relative to the ion beam. Furthermore, such a combination generally maintains a point of impact of the ion beam 205 with the workpiece 202 that is roughly fixed in space, thus generally ensuring that all points on the workpiece are implanted by the beam at the same angles and with the same beam size.

In accordance with yet another exemplary aspect of the present invention, a primary drive actuator (not shown) is operably coupled to the shaft 228, wherein the primary drive actuator is operable to provide a primary rotational force to the shaft. The primary drive actuator, for example, is operable to further vary the rotational velocity of the shaft 228, in conjunction with the motor 206, wherein the position of the workpiece along the first scan path 246 can be further controlled. Accordingly, the motor 206 can generally act as an accelerator and decelerator for the rotation of the shaft 228, while not substantially acting to control the translation of the workpiece 202 within the predetermined scanning range 254 of FIG. 3.

In accordance with another aspect of the invention, a controller 298 is provided, wherein the controller is operable to control the position of the workpiece 202 along the first scan path 246 by controlling the electromagnetic force between the rotor 220 and the stator 222. The controller 298, for example, is further operable to control the rotation of the workpiece 202 about the second axis 240 by controlling the end effector actuator 242. Furthermore, the controller 298 is operable to control the position of the motor 206 along the third axis 282 by controlling the slow scan actuator 280. The controller 298, for example, is operable to control the rotational and/or translation position of the workpiece 202 along the first scan path and second scan path, wherein the control is based, at least in part on the feedback from the one or more sensing elements 270.

Furthermore, according to another exemplary aspect of the invention, the controller 298 (e.g., a motion controller) is operably coupled to one or more power supplies, drivers and/or amplifiers (not shown) associated with the reciprocating scan apparatus 201, such as the motor 201, one or more sensing elements 270, end effector actuator 242, and slow scan actuator 280, wherein the controller efficiently controls the reciprocating scan apparatus.

In accordance with another exemplary aspect of the invention, the general scheme of motion control disclosed in the invention generally provides a smoothness of motion of the end effector 236 (e.g., a constant velocity within the predetermined scanning range 254 of FIG. 3), and can minimize velocity errors associated therewith. According to another example, the controller 298 of FIG. 2 comprises a proportional integral derivative (PID) control device that can be utilized by the controller, wherein the one or more sensing elements 270 provide feedback control.

Figure 4:
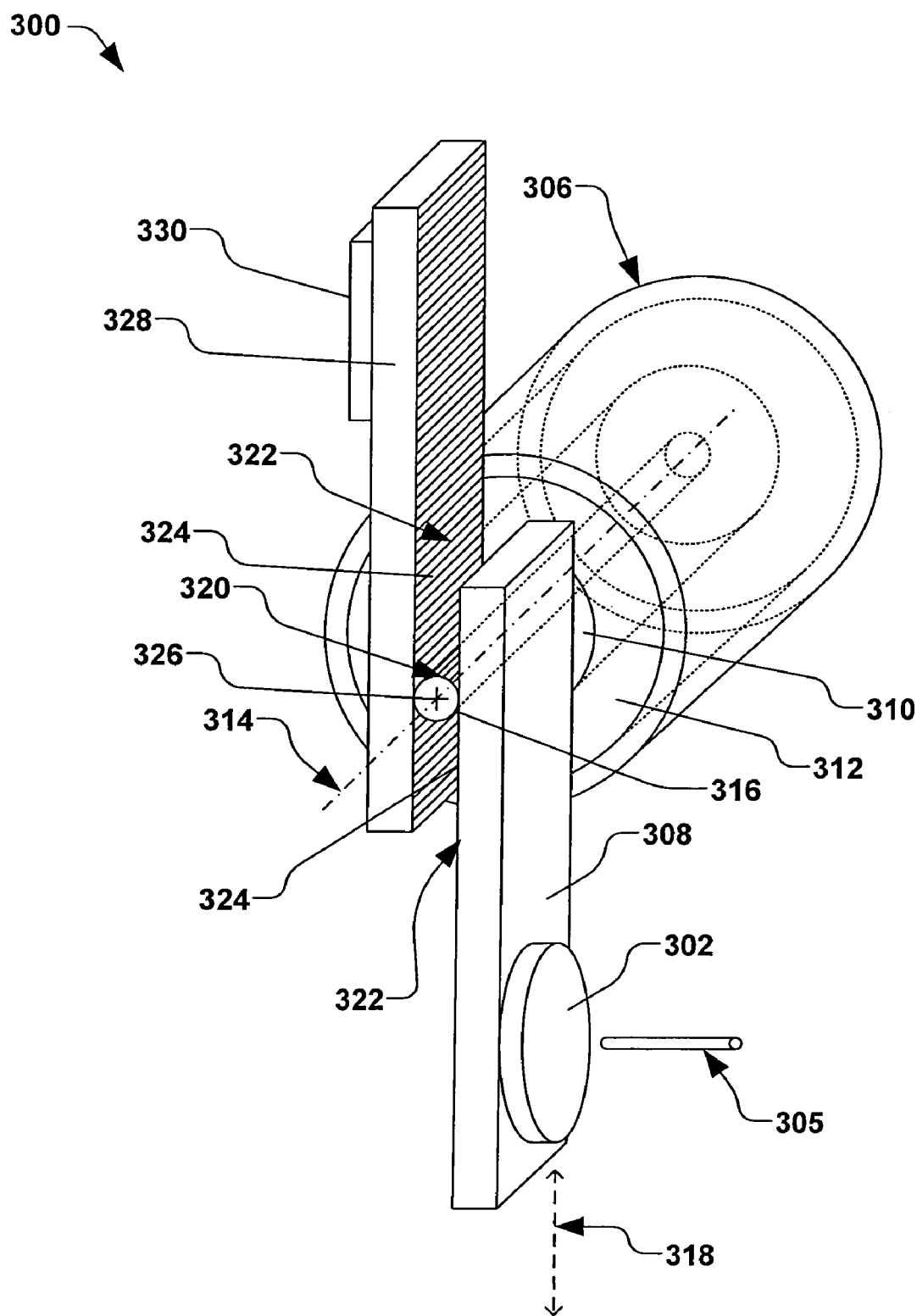
FIG. 4 is a simplified perspective view of another reciprocating drive apparatus according to another aspect of the present invention

While the structure and system disclosed in FIGS. 1-3 relate to a pendulum type motion, the present invention also contemplates a linear motion system, wherein a workpiece translates linearly along a first scan path. For example, FIG. 4 illustrates simplified view of another reciprocating drive apparatus 300 operable to reciprocally translate or oscillate a workpiece 302 along a linear first scan path 304. The reciprocating drive apparatus 300, in one example, is operable to reciprocally translate or oscillate the workpiece 302 along the linear first scan path 304 with respect to a generally stationary ion beam 305, wherein the apparatus can be utilized in an ion implantation process. Alternatively, the reciprocating drive apparatus 300 may be utilized in conjunction with various other semiconductor processing systems, such as a step-and-repeat lithography system (not shown). In yet another alternative, the apparatus 300 can be utilized in processing systems not related to semiconductor technology, and all such systems and implementations are contemplated as falling within the scope of the present invention.

According to one aspect of the present invention, the reciprocating drive apparatus 300 comprises a motor 306 operably coupled to a scan arm 308 wherein the scan arm is further operable to support the workpiece 302 thereon. The motor 306, for example, comprises a rotor 310 and a stator 312, wherein the rotor and the stator are operable to individually rotate about a first axis 314, in a manner similar to that described above. The rotor 310 is further operably coupled to a shaft 316, wherein the shaft generally extends along the first axis 314 and is operably coupled to the scan arm 308. In the present example, the rotor 310 and shaft 316 are generally fixedly coupled to one another, and wherein the shaft and scan arm 308 are in mating engagement with one another, wherein the rotation of the shaft is operable to drive a linear translation of the scan arm, wherein the first scan path 304 is substantially linear. According to one example, the scan arm 308 comprises an engagement portion 320, and wherein the shaft 316 comprises a driver portion 322, and wherein the engagement portion of the scan arm is operably coupled to the driver portion of the shaft. For example, the engagement portion 320 comprises a rack 324 and the driver portion 322 comprises a pinion 326. Alternatively, the engagement portion 320 may comprise a substantially flat surface (not shown), wherein the driver portion comprises a roller (not shown) operable to engage the engagement portion. It will be understood that any engagement portion 320 and driver portion 322 operable to linearly translate the scan arm 308 may be utilized, and all such engagement and driver portions are contemplated as falling within the scope of the present invention.

According to another exemplary aspect of the invention, the reciprocating drive apparatus 300 further comprises a counterbalance arm 328, wherein the shaft 316 and counterbalance arm are further in mating engagement with one another. The counterbalance arm 328, for example, may be diametrically opposed to the scan arm 308 about the shaft 316, wherein the rotation of the shaft is further operable to drive a linear translation of the counterbalance arm in a direction generally opposite that of the scan arm. Such a counterbalance arm 328, for example, may further comprise an inertial mass 330, and further confines inertial forces to the first axis 314. According to another example, the reciprocating drive apparatus further comprises one or more linear translation bearings (not shown), wherein the one or more linear translation bearings generally confine the translation of the scan arm 308 and the counterbalance arm 328 to a linear path.

Figure 5:
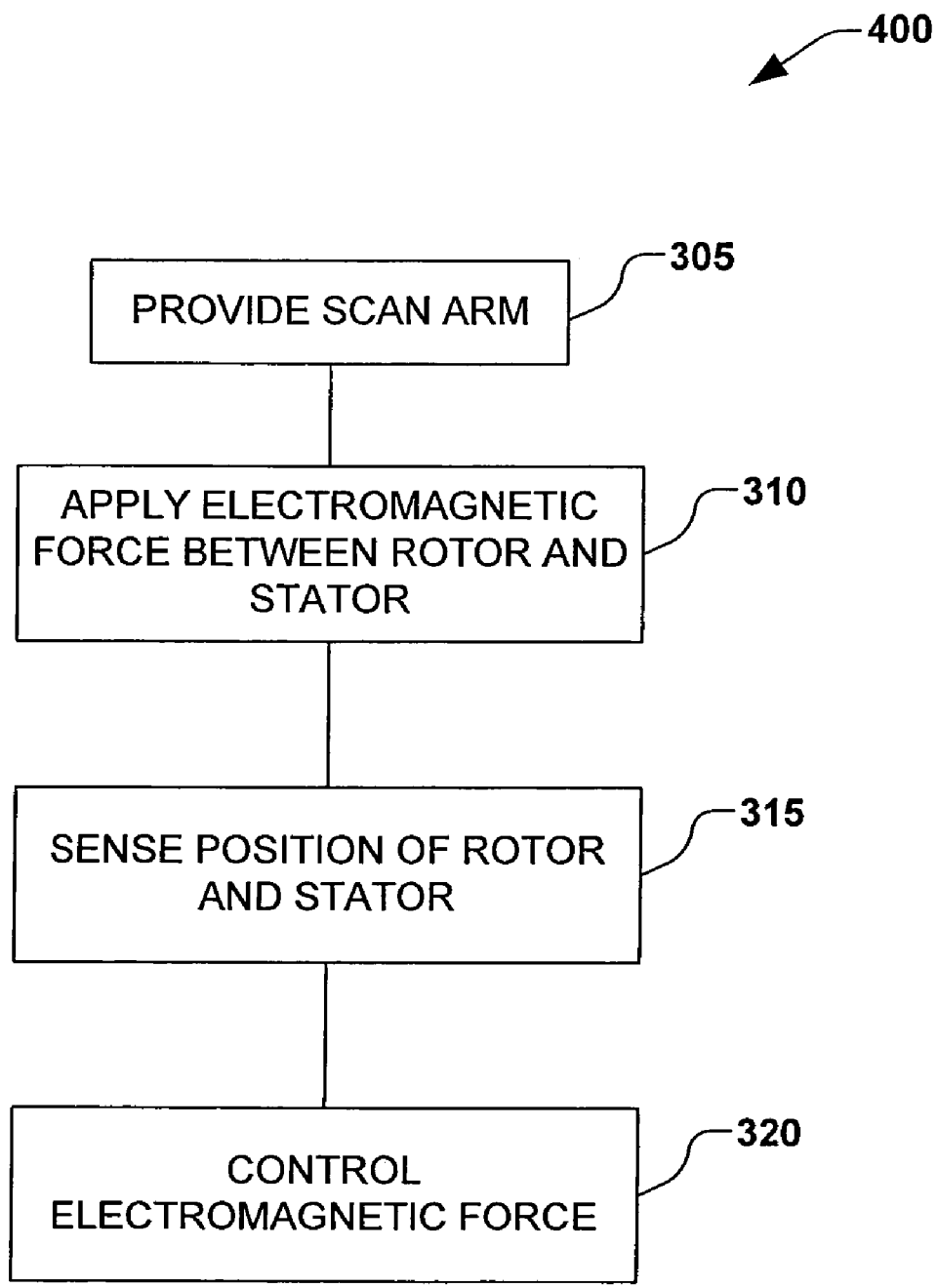
FIG. 5 is a block diagram of a method for reciprocating a workpiece according to another exemplary aspect of the invention.
Figure 6:
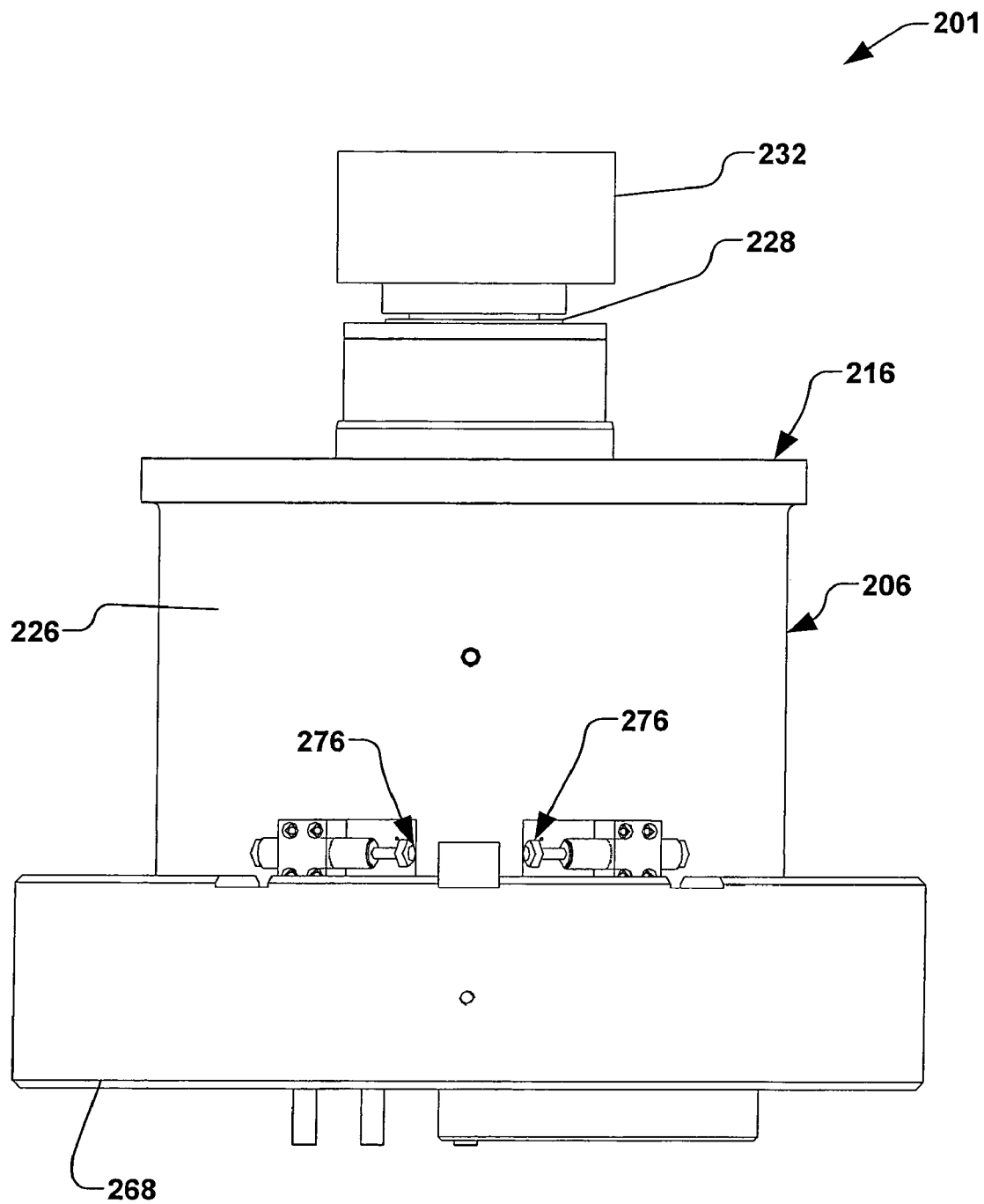
FIGS. 6-8 illustrate several views of an exemplary reciprocating drive apparatus according to yet another exemplary aspect of the invention.
Figure 7:
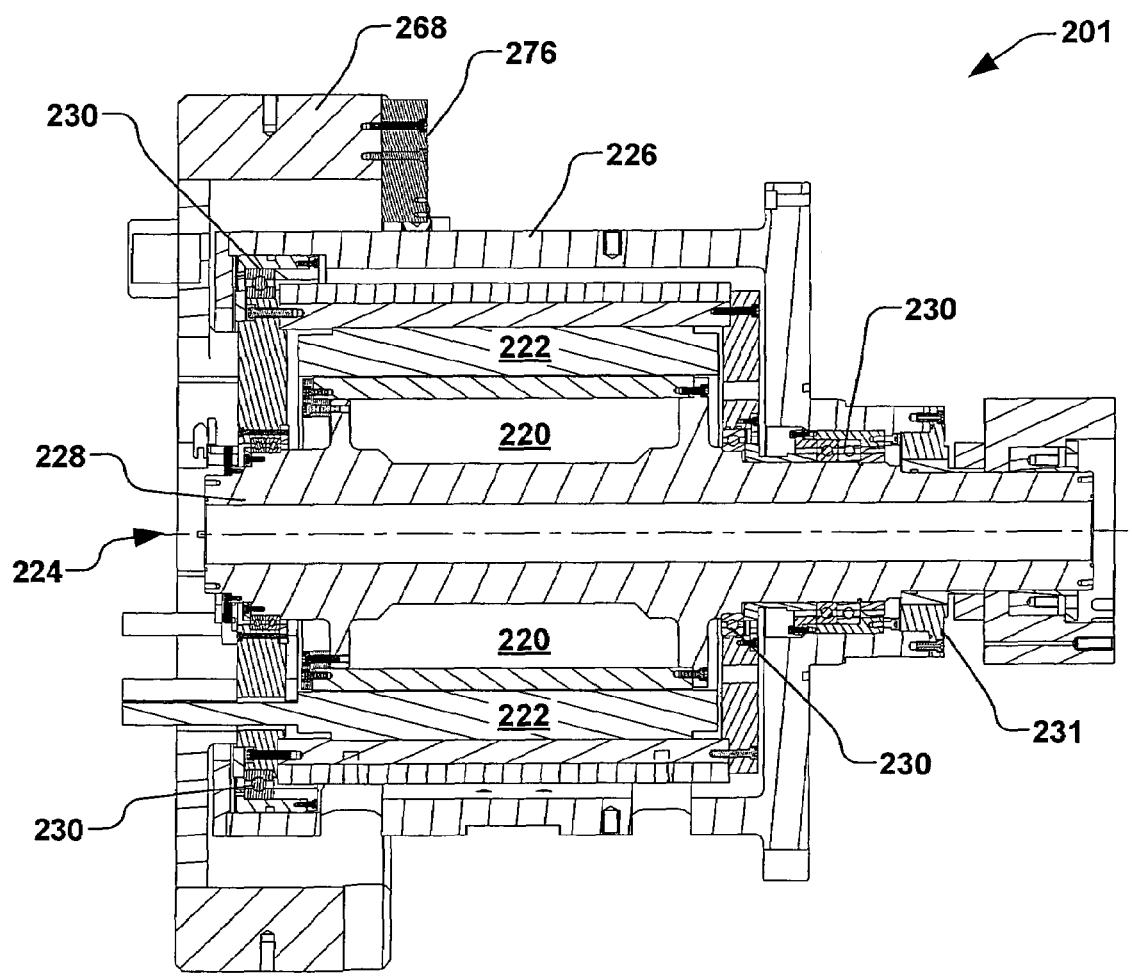
Figure 8:
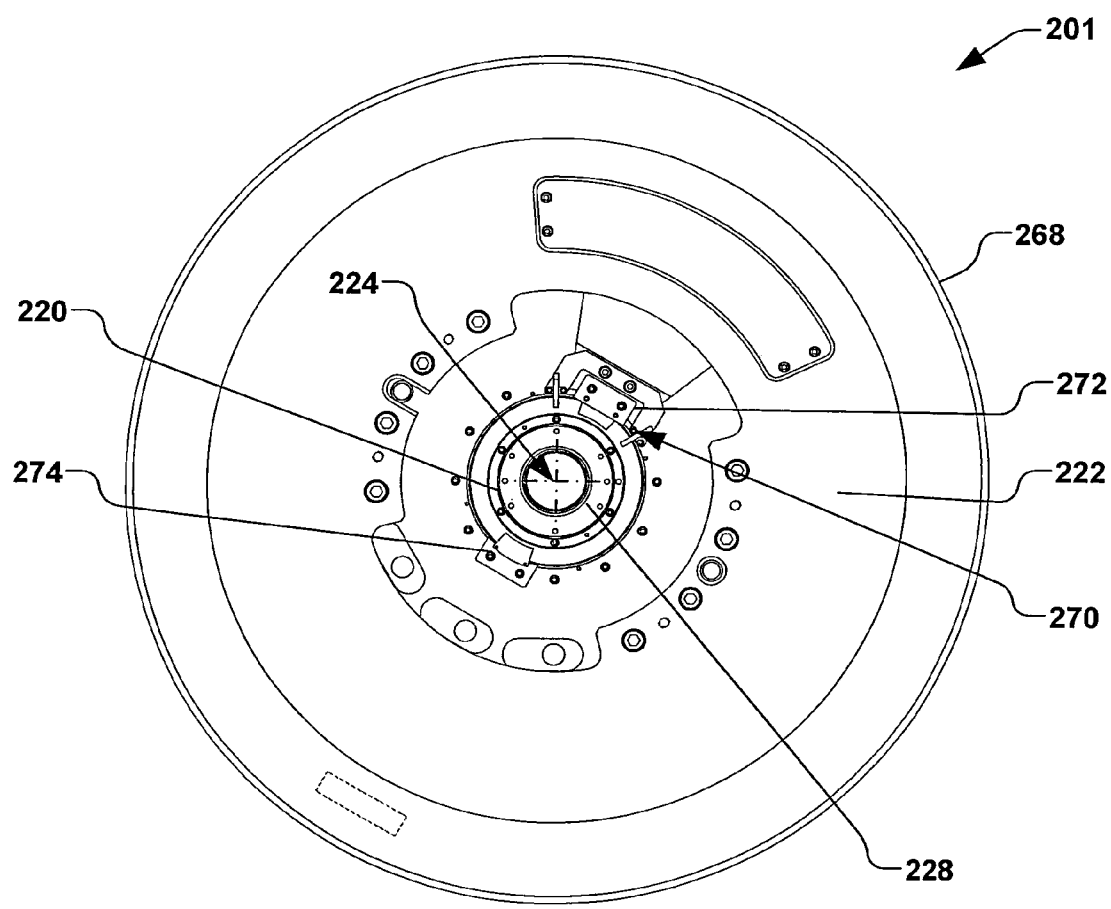

According to still another exemplary aspect of the present invention, FIG. 5 is a schematic block diagram of an exemplary method 400 illustrating the integration and operation of the exemplary reciprocating drive apparatus of FIGS. 1-4. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 5, the method 400 begins with providing a workpiece on a scan arm in act 305, such as the scan arm 232 of FIG. 2. The scan arm is operably coupled to a motor comprising a rotor and a stator, and wherein the rotor and stator are operable to individually rotate and counter-rotate about a first axis. In act 310, an electromagnetic force is applied between the rotor and stator, therein translating the workpiece through an ion beam along a first scan path. In act 315 a position of the workpiece is sensed, such as sensing a rotational position of one or more of the shaft, rotor, and stator about the first axis. In act 320, the electromagnetic force between the rotor and stator is controlled or selectively varied along the first scan path, and wherein the stator rotates and counter-rotates about the first axis in reaction to the reciprocation of the workpiece. The control in act 320, for example, is based, at least in part, on the sensed position of the workpiece.

In accordance with another exemplary aspect of the present invention, the reciprocating drive apparatus can be further utilized in a process chamber (not shown) that is in a state of high vacuum, wherein no mechanical components such as lubricated bearings or actuators are directly exposed to the environment. In order to achieve such ends, the joints of the apparatus, for example, are further provided with vacuum seals, such as Ferro-fluidic seals. It should be understood that any type of movable vacuum seal that provides an integrity of cleanliness of the process is contemplated as falling within the scope of the present invention. Therefore, the present invention is further operable to provide a motion generation and wafer scanning in a clean, vacuum environment.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A reciprocating drive apparatus, comprising:
   a motor comprising a rotor and a stator, wherein the rotor and the stator are operable to individually rotate about a first axis;
   a shaft rotatably driven by the rotor and extending along the first axis; and
   a scan arm operably coupled to the shaft, wherein the scan arm is operable to support a workpiece thereon, and wherein cyclical counter rotations of the shaft are operable to translate the workpiece along a first scan path, wherein the stator is operable to act as a reaction mass to the rotation of the rotor.

2. The reciprocating drive apparatus of claim 1, wherein an electromagnetic force between the rotor and the stator generally determines a respective rotational position of the rotor and the stator about the first axis.

3. The reciprocating drive apparatus of claim 1, further comprising an inertial mass coupled to the stator, wherein the inertial mass is operable to counteract the translation of the scan arm about the first axis.

4. The reciprocating drive apparatus of claim 3, wherein a mass moment of inertia of the inertial mass is associated with a total of mass moments of inertia of the scan arm and workpiece.

5. The reciprocating drive apparatus of claim 1, wherein the scan arm comprises an end effector, wherein the workpiece is generally supported by the end effector.

6. The reciprocating drive apparatus of claim 5, wherein the end effector comprises an electrostatic chuck.

7. The reciprocating drive apparatus of claim 5, wherein the end effector is pivotally mounted to the scan arm, wherein the end effector is operable to rotate about a second axis generally parallel to the first axis.

8. The reciprocating drive apparatus of claim 7, further comprising an end effector actuator operably coupled to the end effector and the scan arm, wherein the end effector actuator is operable to rotate the end effector about the second axis.

9. The reciprocating drive apparatus of claim 1, further comprising a slow scan actuator operably coupled to the motor, wherein the slow scan actuator is operable to linearly translate the motor along a third axis generally perpendicular to the first axis, therein scanning the along a second scan path.

10. The reciprocating drive apparatus of claim 1, wherein the motor is operable to drive the counter-rotations of the shaft with substantially constant velocity.

11. The reciprocating drive apparatus of claim 1, wherein the stator is operable to act as a reaction mass to the rotation of the rotor and translation of the scan arm and workpiece.

12. The reciprocating drive apparatus of claim 1, further comprising a process chamber, wherein the shaft extends through an aperture in the process chamber, wherein the scan arm generally resides within the process chamber and the motor generally resides outside the process chamber, and wherein a rotary seal is provided at an interface between the shaft and the aperture.

13. The reciprocating drive apparatus of claim 1, further comprising one or more sensing elements operable to sense a rotational position of one or more of the shaft, rotor, and stator about the first axis.

14. The reciprocating drive apparatus of claim 13, wherein the one or more sensing elements comprise a first encoder operable to sense a rotational orientation of the rotor with respect to the stator and a second encoder operable to sense a rotational orientation of the rotor with respect to a generally stationary reference.

15. The reciprocating drive apparatus of claim 13, wherein the one or more sensing elements comprise one or more high resolution encoders associated with one or more of the shaft, rotor, and stator.

16. The reciprocating drive apparatus of claim 1, wherein the shaft is substantially hollow.

17. The reciprocating drive apparatus of claim 1, wherein the scan arm is fixedly coupled to the shaft, and wherein the first scan path is curvilinear.

18. A reciprocating drive apparatus, comprising:
a motor comprising a rotor and a stator, wherein the rotor and the stator are operable to individually rotate about a first axis;
a shaft rotatable driven by the rotor and extending along the first axis; and
a scan arm operably coupled to the shaft, wherein the scan arm is operable to support a workpiece thereon, and wherein cyclical counter rotations of the shaft are operable to translate the workpiece along a first scan path, wherein the stator is operable to act as a reaction mass to the rotation of the rotor, wherein the shaft and scan arm are in mating engagement with one another, wherein the rotation of the shaft is operable to drive a linear translation of the scan arm, and wherein the first scan path is substantially linear.

19. The reciprocating drive apparatus of claim 18, wherein the scan arm comprises an engagement portion, and wherein the shaft comprises a driver portion, wherein the engagement portion of the scan arm is operably coupled to the driver portion of the shaft, and wherein the rotation of the shaft drives the linear translation of the scan arm.

20. The reciprocating drive apparatus of claim 19, wherein the engagement portion comprises a rack and the driver portion comprises a pinion.

21. The reciprocating drive apparatus of claim 19, wherein the engagement portion comprises a substantially flat surface, and wherein the driver portion comprises a roller.

22. The reciprocating drive apparatus of claim 18, further comprising a counterbalance arm, wherein the shaft and counterbalance arm are further in mating engagement with one another, wherein the counterbalance arm is diametrically opposed to the scan arm about the shaft, and wherein the rotation of the shaft is operable to drive a linear translation of the counterbalance arm in a direction generally opposite that of the scan arm.

23. The reciprocating drive apparatus of claim 22, further comprising one or more linear translation bearings, wherein the one or more linear translation bearings generally confine the translation of the scan arm and the counterbalance arm to a linear path.

24. The reciprocating drive apparatus of claim 18, further comprising one or more linear translation bearings, wherein the one or more linear translation bearings generally confine the translation of the scan arm to a linear path.

25. A reciprocating drive apparatus, comprising:
a motor comprising a brushless DC motor, the motor further comprising a rotor and a stator, wherein the rotor and the stator are operable to individually rotate about a first axis;
a shaft rotatably driven by the rotor and extending along the first axis; and
a scan arm operably coupled to the shaft, wherein the scan arm is operable to support a workpiece thereon, and wherein cyclical counter rotations of the shaft are operable to translate the workpiece along a first scan path, wherein the stator is operable to act as a reaction mass to the rotation of the rotor.

* * * * *